United States Patent [19]
Pascucci et al.

[11] Patent Number: 5,563,826
[45] Date of Patent: Oct. 8, 1996

[54] MEMORY ARRAY CELL READING CIRCUIT WITH EXTRA CURRENT BRANCH

[75] Inventors: Luigi Pascucci; Carla M. Golla, both of Sesto San Giovanni; Marco Maccarrone, Palestro, all of Italy

[73] Assignee: SGS-Thomson Microelectronics S.r.l., Agrate Brianza, Italy

[21] Appl. No.: 422,813

[22] Filed: Apr. 17, 1995

[30] Foreign Application Priority Data

Apr. 19, 1994 [EP] European Pat. Off. ............ 94830182

[51] Int. Cl.⁶ ............................. G11C 16/06; G11C 7/06
[52] U.S. Cl. ............................. 365/185.21; 365/185.20; 365/185.25
[58] Field of Search ..................... 365/185.20, 185.25, 365/202, 203, 210, 205, 207, 208, 185.21

[56] References Cited

U.S. PATENT DOCUMENTS

| | | | |
|---|---|---|---|
| 4,884,241 | 11/1989 | Tanaka | 365/185.25 |
| 5,138,579 | 8/1992 | Tatsumi | 365/185.25 |
| 5,237,534 | 8/1993 | Tanaka | 365/208 |
| 5,396,467 | 3/1995 | Liu | 365/210 |

FOREIGN PATENT DOCUMENTS 0199501 10/1986 European Pat. Off. .......... G11C 7/00

OTHER PUBLICATIONS

IEE Proceedings G. Electronic Circuits & Systems, vol. 140, No. 2 Apr. 1993, Stevenage GB pp. 117–122, "Design and Analysis of a High Speed Sense Amplifier For Single–Transistor Nonvolatile Memory."IEEE International Solid State Circuits Conference, vol. 31, Feb. 17, 1988, New York US pp. 120–121, "A 90ns 4Mb CMOS EEPROM."

Primary Examiner—David C. Nelms
Assistant Examiner—Son Mai
Attorney, Agent, or Firm—David M. Driscoll; James H. Morris

[57] ABSTRACT

A read circuit comprises at least one array branch connected to at least one bit line, and a reference branch connected to a reference line. The array and reference branches each comprise a precharge circuit and load interposed between the supply and the bit line and reference line respectively. The reference load is so formed as to generate a reference current which, during evaluation, is twice the current supplied to the bit line. The reference line is connected to an extra-current transistor which is only turned on during equalization so that, during equalization, the selected bit line is supplied with a high current approximating that supplied to the reference line. As such, if the cell to be read is written, the output voltage of the array branch is brought rapidly to its natural high value; whereas, if the cell to be read is erased, the output voltage may return to its low value when the extra-current transistor is turned off, thus permitting reading in advance.

30 Claims, 3 Drawing Sheets

MEMORY ARRAY CELL READING CIRCUIT WITH EXTRA CURRENT BRANCH

BACKGROUND OF THE INVENTION

1. Field of the Invention

The present invention relates to a memory array cell reading circuit.

2. Discussion of the Related Art

As is known, in currently marketed nonvolatile memories, the array cells are read by comparing the content of the cells with the known content of a selected reference cell. More specifically, the cell to be read (together with other cells in the same column of the array) is connected to an array bit line, while the reference cell (normally a virgin or erased cell) is connected (possibly with other reference cells in the same column) to a reference line. Via a respective decoding circuit, the bit lines are connected to a current/voltage converter (hereinafter also referred to as an array converter) which in turn is connected to the supply.

The decoding circuit (controlled by a decoding signal) provides for read-enabling a specific bit line by connecting it to the respective array converter. The array converter comprises a precharge circuit and a load connected in series, the node between which constitutes the output of the array converter and is connected to one input of a sense amplifier, another input of which is connected to the output of a reference current/voltage converter (hereinafter also referred to as a reference converter) located between the reference line and supply and presenting the same structure as the array converter.

According to one known solution, the reference converter is the same as that of the array converter, except for the load which is doubled. Additionally, the reference and array converter loads are current mirror connected so that the current supplied to the cell to be read is half that of the current supplied to the reference cell.

Reading consists of (1) a first precharging and equalizing step wherein the selected bit line (connected to the cell to be read) and the reference line are biased to a predetermined voltage, and the cell to be read and the reference cell are appropriately biased at the control terminal; and (2) a detecting step wherein the output of the sense amplifier is read.

In the equalizing step, the output voltage of the reference converter initially falls from the supply value to an intermediate reference value; whereas the output voltage of the array converters initially falls from the supply value to a low value. If the cell to be read is erased, the output voltage subsequently settles at a low value, below the reference value, due to the cell receiving less than the required current (i.e., since the current supplied to the cell to be read is half that of the reference cell). Conversely, if the cell to be read is written, it absorbs almost no current, and the output node switches to a high voltage approximating the supply voltage. The output voltage of the sense amplifier is therefore higher than the reference voltage in the case of a written cell, and is lower than the reference voltage in the case of an erased cell, thus permitting the sense amplifier to distinguish between a written and erased cell once the output voltages of the array and reference converters settle.

In the above circuit, though essential for distinguishing between written and erased cells, the relationship between the reference and array currents is disadvantageous with regard to reading speed. In the case of a written cell, the speed at which the output voltage of the array converter switches to a high voltage after initially falling to a low value from the supply value depends on the amount of current supplied to the cell being read (i.e., the array current). Since the array current is equal to half the reference current, the above known circuit is therefore slow and involves a certain time lapse for the output voltage of the sense amplifier to reach the correct value which enables reading of the cell. What is more, due to the slowness of the circuit, the speed with which the output voltage increases may be so slow as to prevent the reading of a partially programmed (i.e., written) cell within the allotted time for reading the cell, with the result that the cell, though not actually defective and otherwise usable under enhanced speed conditions, must be rejected or redounded.

SUMMARY OF THE INVENTION

It is an object of the present invention to provide a high-speed reading circuit designed to overcome the aforementioned drawback.

An embodiment of the invention is directed to a memory array cell reading circuit comprising at least one array branch coupled to at least one bit line, and a reference branch coupled to a reference line. The array branch and the reference branch each include a precharge circuit and a load interposed between a first reference potential line and the bit line and the reference line, respectively. The load of the reference branch generates a reference current. The load of the array branch generates an array current lower than the reference current during an evaluation phase of the at least one array branch. The circuit further comprises current control means for controlling the load of the array branch to generate a first value of the array current during an equalizing phase, and a second value of the array current during an evaluation phase. A ratio between the first array current value and the reference current is greater than a ratio between the second array current value and the reference current.

Another embodiment of the invention is directed towards a circuit for rapidly reading a memory device having a memory cell that stores a readable value in a reference cell. The circuit comprises an array branch, coupled to the memory cell, having an output that provides an array voltage; a reference branch, coupled to the reference cell, having an output that provides a reference voltage; and a sense amplifier having a first input coupled to the output of the array branch, a second input coupled to the output of the reference branch, and an output for providing a signal that identifies the readable value stored in the memory cell. The circuit further includes means for increasing an array current through the array branch when the circuit is in an equalizing state so that a settling time of the array voltage of the array branch output is reduced.

Another embodiment of the invention is directed towards a method for rapidly reading a memory device having a memory cell that stores a readable value and a reference cell. The method comprises the steps of (a) supplying a reference current to the reference cell to generate a reference voltage, and supplying an array current to the memory cell to generate an array voltage; (b) increasing the array current to the memory cell so that a settling time of the array voltage is reduced; and (c) comparing the reference voltage and the array voltage, and providing a comparison result that identifies the readable value stored in the memory cell.

Another embodiment of the invention is directed towards a circuit for rapidly reading a memory device having a memory cell that stores a readable value and a reference cell. The circuit comprises an array branch, coupled to the memory cell, having an output that provides an array voltage; a reference branch, coupled to the reference cell, having an output that provides a reference voltage; and a sense amplifier having a first input coupled to the output of the array branch, a second input coupled to the output of the reference branch, and an output for providing a signal that identifies the readable value stored in the memory cell. The circuit further includes an extra-current branch that increases an array current through the array branch when the circuit is in an equalizing state so that a settling time of the array voltage of the array branch is reduced.

BRIEF DESCRIPTION OF THE DRAWINGS

A preferred, non-limiting embodiment of the present invention will be described by way of example with reference to the accompanying drawings, in which.

DETAILED DESCRIPTION

Figure 1:
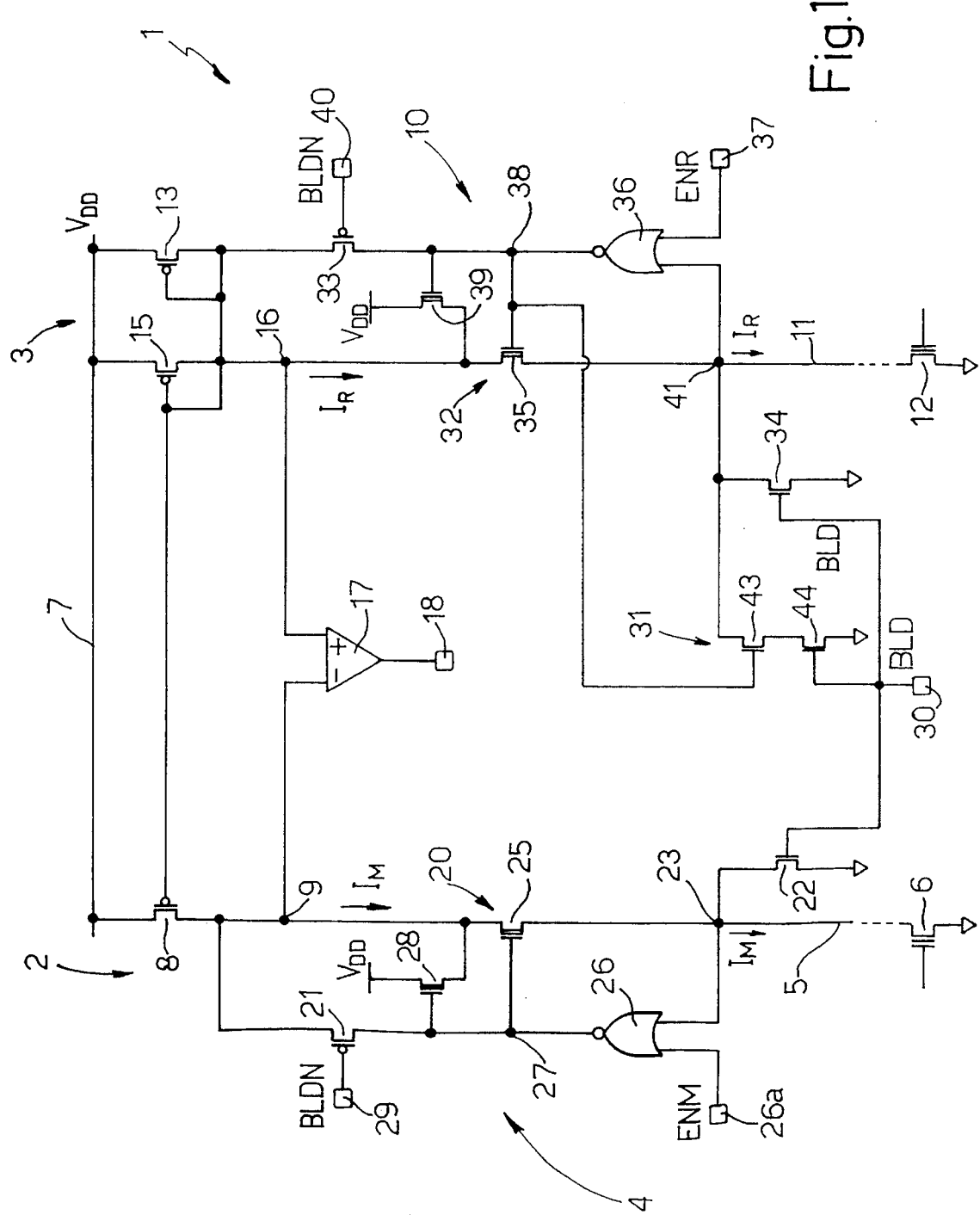
FIG. 1 shows a reading circuit in accordance with the present invention.

Number 1 in FIG. 1 indicates a reading circuit comprising, in known manner, a number of array reading branches 2 (only one shown), and a reference branch 3. Array reading branch 2 comprises a precharge circuit 4 connected (via a decoding circuit not shown) to a number of bit lines 5 (only one shown); and bit line 5 is connected to a number of cells of which only cell 6 to be read at a given time is shown. Precharge circuit 4 is connected to a supply line 7 at voltage VDD via a load composed of a P-channel MOS transistor 8; and precharge circuit 4 and transistor 8 form a current/voltage converter, the output of which consists of the drain terminal of transistor 8 (i.e., node 9).

Similarly, reference branch 3 presents a precharge circuit 10 connected to a reference line 11 in turn connected to a reference cell 12 or, like bit lines 5, to a number of reference cells in one column. The load is located between precharge circuit 10 and supply line 7, and in this case is composed of two P-channel MOS-transistors 13 and 15 (i.e., loads) of the same size and fabrication specifications as transistor 8, but diode-connected. In this case also, precharge circuit 10 and loads 13 and 15 form a current/voltage converter, the output of which is formed by an intermediate node 16 between transistors 13 and 15 and precharge circuit 10.

More specifically, transistors 13 and 15 present the gate terminals connected to each other, to the respective drain terminals, to the gate terminal of load transistor 8 of array reading branch 2, and to node 16.

Node 16 of reference branch 3 and node 9 of array reading branch 2 are connected to respective inputs of a sense amplifier 17, the output 18 of which defines the output of circuit 1.

The example described above presents one reference branch 3 that includes transistors 13 and 15 that provide for multimirroring controlling of the gate terminals of the transistor 8 of each array reading branch 2 (one for each sense amplifier 17) by means of a simple solution with very little dissipation. Alternatively, a reference branch 3 may be provided for each sense amplifier 17, i.e. for each array reading branch 2.

Array precharge circuit 4 comprises a cascode stage 20 interposed between node 9 and bit line 5; a pair of stabilizing transistors 21 and 22 for preventing voltage overshooting on the bit line; and a fast precharge transistor 28.

More specifically cascode stage 20 comprises a first native, i.e. low-threshold, N-channel transistor 25 connected at the drain terminal to node 9 and at the source terminal (node 23) to bit line 5; and a NOR gate 26 with a first input connected to bit line 5, a second input connected to a node 26a supplied with a logic signal ENM, and an output (node 27) connected to the gate terminal of transistor 25.

A first stabilizing transistor 21 is a P type with the source terminal connected to node 9, the drain terminal connected to the output of NOR gate 26, and the gate terminal connected to a node 29 supplied with a logic signal BLDN. The second stabilizing transistor 22 is an N type with a grounded source terminal, the drain terminal connected to bit line 5, and the gate terminal connected to a node 30 supplied with a logic signal BLD which is opposite to logic signal BLDN. Fast precharge transistor 28, which is a native N-channel type, is connected at the drain terminal to VDD supply line 7, at the source terminal to node 9, and at the gate terminal to the output of NOR gate 26.

Reference precharge circuit 10 presents the same structure as array precharge circuit 4, except for an extra-current branch 31.

Reference precharge circuit 10 therefore presents a cascode stage 32; first and second stabilizing transistors 33 and 34; and a fast precharge transistor 39. Cascode stage 32 in turn comprises a native N-channel transistor 35 connected at the drain terminal to node 16, and at the source terminal (node 41) to reference line 11; and a NOR gate 36 with a first input connected to reference line 11, a second input connected to a node 37 supplied with a logic signal ENR, and the output (node 38) connected to the gate terminal of transistor 35.

Transistor 33 is a P type with the source terminal connected to node 16, the drain terminal connected to node 38, and the gate terminal connected to a node 40 which is in turn connected to node 29 and therefore supplied with logic signal BLDN. Transistor 34 is an N type with a grounded source terminal, the drain terminal connected to reference line 11, and the gate terminal connected to node 30. Fast precharge transistor 39, which is a native N-channel type, is connected at the drain terminal to VDD supply line 7, at the source terminal to node 16, and at the gate terminal to node 38.

Extra-current branch 31 comprises an N type extra-current transistor 43 with the source terminal connected to reference line 11, the gate terminal connected to node 38, and the drain terminal grounded via a switch 44. The extra-current transistor is so sized that, upon biasing of reference line 11 by cascode stage 32, it absorbs a current approximating that of reference cell 12. More specifically, switch 44 is formed by an N-channel transistor with the source terminal connected to the drain terminal of extra-current transistor 43, a grounded drain terminal, and the gate terminal connected to node 30.

The FIG. 1 circuit operates as follows. Upon enabling of the equalizing step by signals ENM and ENR switching to low, signal BLD is high, so that, disregarding for the time being transistors 21, 22, 28, 33, 34, 39 and 43, cascode stages 20 and 32 are enabled to bring bit line 5 and reference line 11 to a predetermined voltage, e.g. 1 V. More specifically, the formerly low outputs of gates 26 and 36 switch to high (lines 5 and 11 are discharged and grounded) thus turning on transistors 25 and 35 which connect load transistor 8 to line 5 and transistors 13 and 15 to line 11; lines 5 and 11 (which are capacitive) begin charging, and so raise the voltage at nodes 23 and 41, and lower the voltage at nodes 9 and 16. The increase in voltage at nodes 23 and 41, and hence in the voltage supplied to gates 26 and 36, is accompanied by a fall in voltage at the outputs of gates 26 and 36, and hence in the voltage at the control terminals of transistors 25 and 35, which therefore conduct less and tend to decouple nodes 9 and 16 from nodes 23 and 41, respectively, which therefore fall in voltage. In other words, at this step, as the voltage of lines 5 and 11 each increases, they are reduced by gates 26 and 36, respectively, at least partly turning off transistors 25 and 35; and, as the voltage of lines 5 and 11 fall, they are increased by gates 26 and 36 turning on transistors 25 and 35, respectively, to a greater extent; this opposed combined action achieves a balanced condition (bias) wherein transistors 25 and 35 are turned on by no more than the amount required for ensuring a predetermined voltage of lines 5 and 11.

Fast precharge transistors 28, 39 provide for accelerating the above step, on account of load transistors 8, 13, 15 being fairly resistive and so having a current limiting effect preventing rapid charging of the bit lines (and rapid attainment of the desired bias condition). To speed up charging of lines 5 and 11 (which, as stated, are capacitive), low-resistance transistors 28 and 39 are turned on initially to supply a high current, and, as the voltage at nodes 23 and 41 increases, i.e., on nearing the desired bias condition, are turned off automatically by the output voltage of gates 26 and 36 decreasing and so reducing the gate-source voltage drop of transistors 28 and 39 until they are eventually turned off. Transistors 28 and 39 are therefore only turned on at the very start of the equalizing phase for accelerating it.

To ensure the desired bias condition is achieved, transistors 21 and 33 also provide for an auxiliary function, that of ensuring respective transistors 25 and 35, respectively, are never turned off completely. In fact, in the absence of transistors 21 and 33, node 23 or 41 could possibly overshoot the predetermined level (e.g., on account of the intrinsic delay of cascode 20 or in the presence of undesired connections with other lines in the array) to the extent that the output of gate 26 or 36 falls so low as to turn off transistor 25 or 35, respectively, and bring node 9 or 16 back to the voltage of supply line 7; in that case, sensing amplifier 17 could mistake an erased cell for a written one. This, however, is prevented by transistors 21 and 33, which connect the output of gates 26 and 36 to nodes 9 and 16, respectively, to prevent the voltages at nodes 27 and 28 from falling below a given level at which transistors 25 and 35 are guaranteed to remain on.

Transistors 22 and 34 also provide for preventing lines 5 and 11, should they be charged to too high a level, from turning off transistors 25 and 35, respectively. For which purpose, any tendencies of lines 5 or 11 to rise excessively, due to excess current from load 8 or loads 13 and 15 are counteracted by transistors 22 or 34 (which are of small size) absorbing part of the surplus current. Transistors 22 and 34 also provide for grounding bit line 5 and reference line 11, respectively, when these are floating (i.e., when circuit 1 is not in read mode).

Extra-current transistor 43 provides for rapidly bringing back up the voltage at output node 9 of the array branch in the event the cell to be read has been written. As already stated, once the precharge (bias) conditions of lines 5 and 11 are achieved, a written cell 6 is nonconductive and therefore does not absorb the current supplied by load 8, so that the voltage at node 9 (output of array branch 2) increases once more to the supply voltage. Since the current supplied by array load 8 to bit line 5 is less than (half of) that supplied by reference loads 13 and 15 to bit line 11 (or at any rate half of that requested by cell 6), the increase in the voltage at node 9, in the absence of transistor 43, would be slow by virtue of depending on the current supplied by load 8, so that a far from negligible time lapse would exist between the start of precharging and the output voltage reaching the steady-state value, thus slowing down reading as a whole.

With the FIG. 1 circuit, on the other hand, the increase in the output voltage at node 9 in the presence of a written cell is accelerated by transistor 43 which is kept on by switch 44 during initial precharging of lines 5 and 11 and for a brief period as the voltage at node 9 settles, and which absorbs a current added to that absorbed by reference cell 12 and supplied by loads 13 and 15. The total current supplied by loads 13 and 15 is therefore greater than that required by reference cell 12, and more specifically each of loads 13 and 15 supplies approximately the current required by cell 12. Since the current supplied by each of loads 13 and 15 is mirrored in array load transistor 8, the current supplied to bit line 5 approximates that of reference cell 12, so that, if cell 6 is written and nonconductive, the voltage at output 9, after falling to the predetermined voltage, is restored rapidly to a value approximating the supply voltage.

The extra-current is only maintained for part of the settling phase of the voltage at output node 9. In fact, in the case of an erased, instead of a written, cell 6, the increase in the current supplied by load 8 produces an increase in the output voltage at node 9, which increase must be limited as far as possible to ensure a sufficient difference between the output voltage of the array and the reference voltage for safely discriminating between an erased and written cell. As such, transistor 43 is only kept on long enough to rapidly increase the output voltage at node 9 in the case of a written cell, and is turned off as soon as possible by switching signal BLD to low. In the case of an erased cell 6, therefore, the output voltage at node 9 is maintained at all times below the reference voltage (i.e., the voltage at node 16), and is then restored to its normal low level to permit correct comparison with the reference voltage.

In other words, extra-current transistor 43 ensures that the ratio R1 of the current $I_M$ supplied to the bit line 5 to the current $I_R$ supplied to the reference line 11 during equalization is greater than the ratio $R_2$ between the same currents during evaluation.

Figure 2:
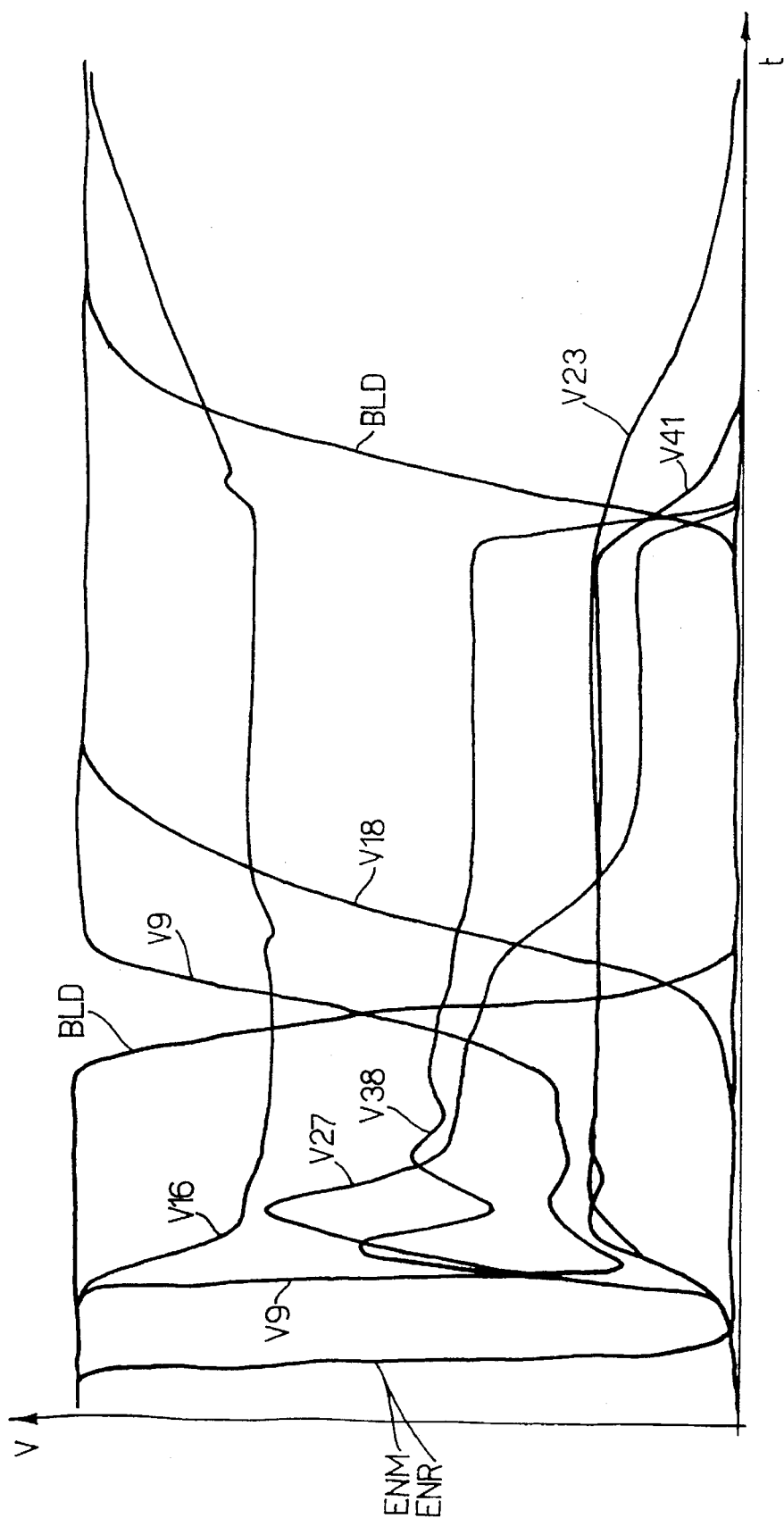
FIGS. 2 and 3 show diagrams of the voltages at various points of the FIG. 1 circuit in the cases of a written cell and an erased cell, respectively.
Figure 3:
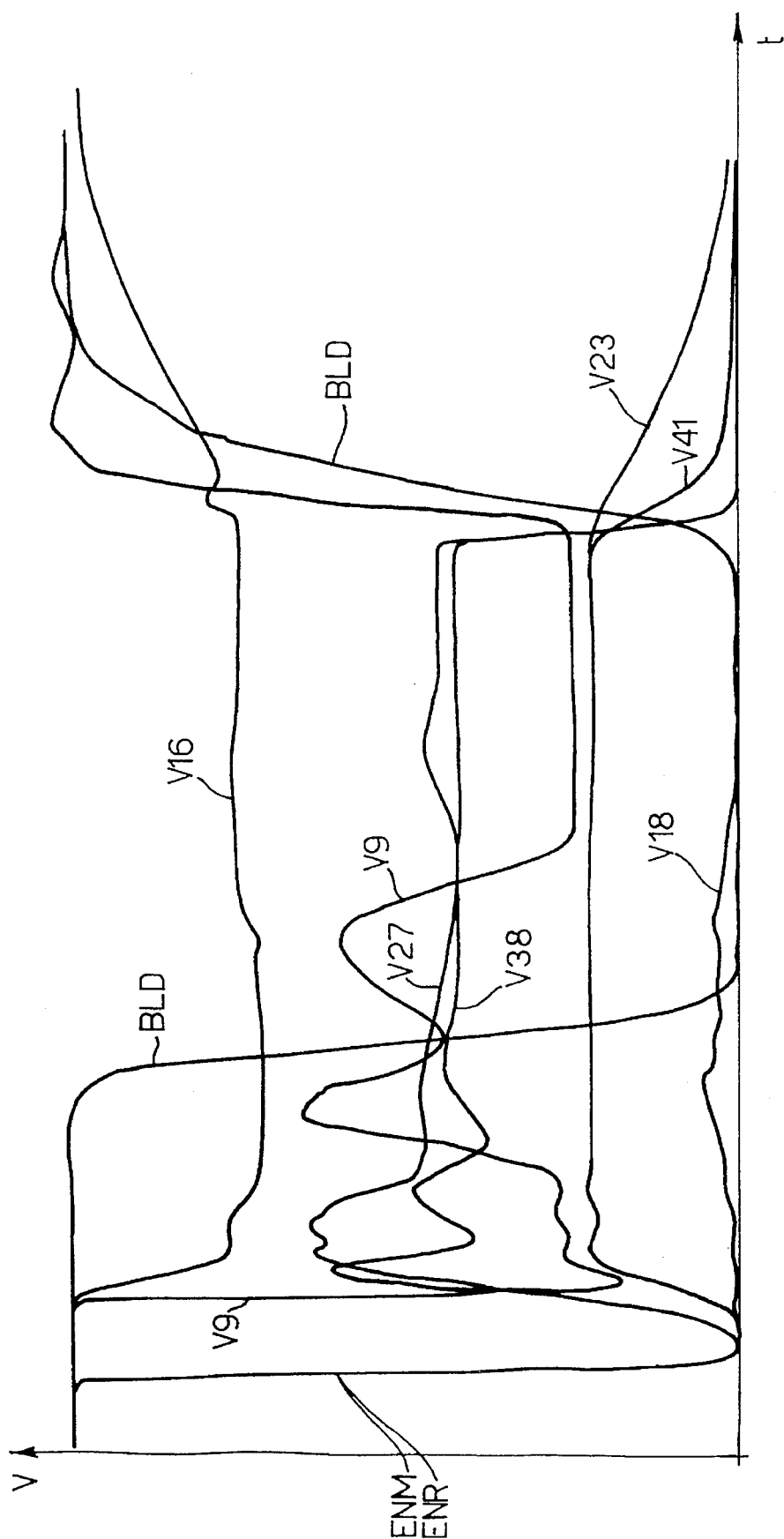

An example of the voltages obtainable in the FIG. 1 circuit in the case of a written or erased cell 6 is shown in FIGS. 2 and 3 respectively, wherein the voltages at nodes 9, 16, 18, 23, 27, 38 and 41 are indicated as V9, V16, V18, V23, V27, V38 and V41, respectively.

As shown in FIG. 2 (relative to a written cell 6), following its initial fall, the voltage at output node 9 rises rapidly so that output voltage V18 reaches the steady-state value in advance as compared with known circuits.

Conversely, in the case of an erased cell 6 (FIG. 3), after falling and oscillating about a predetermined value, the voltage at output node 9 increases to an intermediate value higher than that of standard circuits (yet still lower than that of reference voltage V16); and, following switching of signal BLD (with a delay due to the intrinsic turn-off time of transistor 43), switches to its natural lower level. The delay with which the output voltage reaches its natural value in the case of an erased cell is in any case less than the advance provided for by the extra-current; and, bearing in mind that voltage V9 never exceeds reference voltage V16, the present circuit clearly provides for reading the output voltage V18 of sensing amplifier 17 in advance with respect to known circuits.

The circuit described also provides for reading partially programmed cells which are slower than those programmed correctly, so that array output node 9 fails to reach the steady-state value within the normally allotted read time, and which, with known circuits, were therefore rejected or redounded during evaluation. With the circuit described, on the other hand, by accelerating the voltage increase, the output voltage of such cells manages to reach the steady-state value within the allotted read time, thus permitting otherwise unusable cells to be salvaged.

The circuit described therefore provides for a high degree of reliability by permitting reading of the cells even under less than optimum conditions involving atypically erased or written cells. Transistors 21, 22, 28, 33 and 34 in fact provide for precharging the bit and reference lines to the correct value even under such difficult conditions. In the case, for example, of an overerased, i.e. highly conductive, cell 6 resulting in an excessive fall in the voltage of bit line 5 and an increase in voltage at output 27 of gate 26, transistor 28 may be turned on again (due to the gate-source voltage drop being restored to a value greater than the threshold value) and so contribute towards the current supplied to cell 6, for arresting the fall in voltage on the bit line and achieving more stable voltage levels.

Moreover, transistor 43 provides for a high degree of working stability, even at different supply voltages, by virtue of its control terminal being connected to node 38, the voltage of which (though subject to oscillation at the start of precharging) is fairly stable alongside variations in supply voltage.

Clearly, changes may be made to the circuit as described and illustrated herein without, however, departing from the scope of the present invention. In particular, other solutions may be provided for supplying the selected bit line with a higher current during precharging, and subsequently reducing the current to permit correct comparison of the output voltage of the selected cell with the reference voltage.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory array cell reading circuit comprising:

at least one array branch coupled to at least one bit line, the at least one array branch including a precharge circuit and a load interposed between a first reference potential line and the at least one bit line, the load supplying a first value and a second value of an array current to the at least one bit line during an equalization phase and an evaluation phase, respectively;

a reference branch coupled to a reference line; the reference branch including a precharge circuit and a load interposed between the first reference potential line and the reference line, the load supplying a first value and a second value of a reference current to the reference line during the equalization phase and the evaluation phase, respectively; and current control means for controlling the load of the array branch and the load of the reference branch so that a ratio of the first array current value to the first reference current value is greater than a ratio of the second array current value to the second reference current value, wherein said current control means includes a switchable current source, and wherein said switchable current source is disposed in parallel to a reference cell of known content coupled to the reference line, said switchable current source being connected to said reference line.

2. The circuit of claim 1, wherein said switchable current source includes an extra-current transistor having a first terminal, a second terminal, and a control terminal; said first terminal of said extra-current transistor being coupled to said reference line; said second terminal being coupled to a second reference potential line; and said control terminal being coupled to said reference precharge circuit.

3. The circuit of claim 2, wherein said reference precharge circuit includes a cascode stage including:

a precharge transistor interposed between said load of said reference branch and said reference line; and an inverting element coupled between a first terminal and the control terminal of said precharge transistor; said control terminal of said extra-current transistor being coupled to said control terminal of said precharge transistor.

4. The circuit of claim 2, wherein said current control means further includes:

a controlled switch interposed between said second terminal of said extra-current transistor and said second reference potential line; said controlled switch having a control terminal for receiving a logic open/close signal.

5. A memory array cell reading circuit comprising:

at least one array branch coupled to at least one bit line, the at least one array branch including a precharge circuit and a load interposed between a first reference potential line and the at least one bit line, the load supplying a first value and a second value of an array current to the at least one bit line during an equalization phase and an evaluation phase, respectively;

a reference branch coupled to a reference line; the reference branch including a precharge circuit and a load interposed between the first reference potential line and the reference line, the load supplying a first value and a second value of a reference current to the reference line during the equalization phase and the evaluation phase, respectively; and current control means for controlling the load of the array branch and the load of the reference branch so that a ratio of the first array current value to the first reference current value is greater than a ratio of the second array current value to the second reference current value;

wherein said array precharge circuit and said reference precharge circuit each include a cascode stage including a precharge transistor and an inverting element; said precharge transistor of said array precharge circuit being interposed between said load of said array branch and said bit line; said inverting element of said array precharge circuit being coupled between a first terminal and a control terminal of said precharge transistor of said array precharge circuit; said precharge transistor of said reference precharge circuit being interposed between said load of said reference branch and said reference line; and said inverting element of said reference precharge circuit being coupled between a first terminal and a control terminal of said precharge transistor of said reference precharge circuit.

6. The circuit of claim 5, wherein the array branch further includes a first array stabilizing circuit coupled between said bit line and a second reference potential line; and wherein the reference branch further includes a first reference stabilizing circuit being coupled between said reference line and said second reference potential line.

7. The circuit of claim 6, wherein said first array and reference stabilizing circuits each have a switchable transistor.

8. The circuit of claim 5, wherein the array branch further includes a second array stabilizing circuit coupled between said load of said array branch and said control terminal of said precharge transistor of said array branch; and a second reference stabilizing circuit coupled between said load of said reference branch and said control terminal of said precharge transistor of said reference branch.

9. The circuit of claim 5, wherein said array precharge circuit includes a first fast precharge transistor interposed between said reference potential line and an intermediate node between said load and said precharge circuit of said array branch; and said reference precharge circuit includes a second fast precharge transistor interposed between said reference potential line and an intermediate node between said load and said precharge circuit of said reference branch.

10. The circuit of claim 9, wherein said first and second fast precharge transistors each presents a control terminal coupled to said control terminal of said precharge transistor of said precharge circuit.

11. A circuit for reading a memory device having a memory cell that stores a readable value and a reference cell, the circuit comprising:

an array branch, coupled to the memory cell, having an output that provides an array voltage;

a reference branch, coupled to the reference cell, having an output that provides a reference voltage;

a sense amplifier having a first input coupled to the output of the array branch, a second input coupled to the output of the reference branch, and an output for providing a signal that identifies the readable value stored in the memory cell according to the array and reference voltages when the circuit is in a determining state; and means for increasing a first value of an array current supplied to the memory cell when the circuit is in an equalizing state relative to a second value of the array current supplied to the memory cell when the circuit is in the determining state;

wherein the array branch includes a first current source for providing the array current, the first and second values of the array current being a predetermined fraction of a first value and a second value of a drive current supplied to the reference branch, respectively, and wherein the means for increasing includes:

an extra-current branch, coupled to the reference branch, to absorb a portion of the drive current from the reference branch.

12. The circuit of claim 11, wherein the reference branch includes:

a second current source having a first end coupled to a first voltage reference line, and a second end; and a precharge stage having a first end coupled to the second end of the second current source and second end coupled to the reference cell; and wherein the extra-current branch includes:

an extra-current transistor, coupled to the precharge stage; and a switch coupled between the extra-current transistor and a second voltage reference line.

13. The circuit of claim 12, wherein the switch includes:

a transistor having a source terminal coupled to the extra-current transistor, a drain terminal coupled to the second voltage reference line, and a control terminal for receiving a control signal.

14. The circuit of claim 12, wherein the precharge stage of the reference branch includes:

a charging transistor having a drain terminal coupled to the second end of the second current source, a source terminal coupled to the reference cell, and a control terminal that receives a charging signal, and wherein the extra-current transistor includes:

a source terminal coupled to the source of the charging transistor, a drain terminal coupled to the switch, and a control terminal coupled to the control terminal of the charging transistor.

15. The circuit of claim 12, wherein the extra-current transistor is sized to absorb a current value which approximately equals a first value of a reference current supplied to the reference cell.

16. The circuit of claim 15, wherein a ratio of the first value of the array current to the first value of the reference current when the circuit is in the equalizing state is greater than a ratio of the second value of the array current to a second value of the reference current when the circuit is in the determining state.

17. A method for reading a memory device having a memory cell that stores a readable value and a reference cell, the method comprising the steps of:

A. supplying a reference current to the reference cell to generate a reference voltage including a step of supplying a drive current that includes the reference current;

B. supplying an array current to the memory cell to generate an array voltage including a step of supplying an array current which is a predetermined fraction of the drive current;

C. increasing the array current to the memory cell during an equalizing stage including a step of absorbing a portion of the drive current;

D. comparing the reference voltage and the array voltage during a determining stage; and E. providing a comparison result that identifies the readable value stored in the memory cell according to the reference and array voltages.

18. The method of claim 17, wherein the step of absorbing includes the step of receiving the portion of the drive current through an extra-current branch when the extra-current branch is in an "ON" state.

19. The method of claim 18, wherein the step of absorbing further includes the steps of:

receiving a control signal; and switching the extra-current branch between an "OFF" state and the "ON" state according to the received signal.

20. The method of claim 17, wherein step A includes the step of:

passing the drive current through a charging transistor, and wherein the step of absorbing includes the step of:

absorbing current from the charging transistor.

21. The method of claim 17, wherein the portion of the drive current absorbed is approximately equal to the reference current supplied to the reference cell.

22. A circuit for reading a memory device having a memory cell that stores a readable value and a reference cell, the circuit comprising:

an array branch, coupled to the memory cell, having an output that provides an array voltage;

a reference branch, coupled to the reference cell, having an output that provides a reference voltage;

a sense amplifier having a first input coupled to the output of the array branch, a second input coupled to the output of the reference branch, and an output for providing a signal that identifies the readable value stored in the memory cell according to the array and reference voltages when the circuit is in a determining state; and an extra-current branch that increases a first value of an array current supplied to the memory cell when the circuit is in an equalizing state relative to a second value of the array current supplied to the memory cell when the circuit is in the determining state;

wherein the reference branch includes a current source that provides a first value and a second value of a drive current to the reference branch, and the array branch includes a current source that provides the first and second values of the array current to the memory cell, the current sources of the reference and array branches forming a current mirror, such that the array current is a predetermined fraction of the drive current, the extra-current branch being coupled to the reference branch to absorb a portion of the drive current from the reference branch.

23. The circuit of claim 22, wherein the current source of the reference branch includes:

a first end coupled to a first voltage reference line, and a second end; and the reference branch further includes a precharge stage having a first end coupled to the second end of the current source of the reference branch and second end coupled to the reference cell; and wherein the extra-current branch includes:

an extra-current transistor coupled to the precharge stage; and a switch coupled between the extra-current transistor and a second voltage reference line.

24. The circuit of claim 23, wherein the switch includes:

a transistor having a source terminal coupled to the extra-current transistor, a drain terminal coupled to the second voltage reference line, and a control terminal for receiving a control signal.

25. The circuit of claim 23, wherein the precharge stage of the reference branch includes:

a charging transistor having a drain terminal coupled to the second end of the current source, a source terminal coupled to the reference cell, and a control terminal that receives a charging signal, and the extra-current transistor includes:

a source terminal coupled to the source of the charging transistor, a drain terminal coupled to the switch, and a control terminal coupled to the control terminal of the charging transistor.

26. The circuit of claim 23, wherein the extra-current transistor is sized to absorb a current value which approximately equals a first value of a reference current supplied to the reference cell.

27. The circuit of claim 26, wherein a ratio of the first value of the array current to the first value of the reference current when the circuit is in the equalizing state is greater than a ratio of the second value of the array current to a second value of the reference current when the circuit is in the determining state.

28. A memory, comprising:

at least one memory cell that stores a readable value and a reference cell; and a circuit for reading the memory cell having an array branch, coupled to the memory cell, having an output that provides an array voltage, a reference branch, coupled to the reference cell, having an output that provides a reference voltage, a sense amplifier having a first input coupled to the output of the array branch, a second input coupled to the output of the reference branch, and an output for providing a signal that identifies the readable value stored in the memory cell according to the array and reference voltages when the circuit is in a determining state, and means for increasing a first value of an array current supplied to the memory cell when the circuit is in an equalizing state relative to a second value of the array current supplied to the memory cell when the circuit is in the determining state;

wherein the array branch includes a current source for providing the array current, the first and second values of the array current being a predetermined fraction of a first value of a drive current supplied to the reference branch, respectively, and wherein the means for increasing includes an extra current branch, coupled to the reference branch, to absorb a portion of the drive current.

29. A memory, comprising:

at least one memory cell that stores a readable value and a reference cell; and a circuit for reading the memory cell having an array branch, coupled to the memory cell, having an output that provides an array voltage, a reference branch, coupled to the reference cell, having an output that provides a reference voltage, a sense amplifier having a first input coupled to the output of the array branch, a second input coupled to the output of the reference branch, and an output for providing a signal that identifies the readable value stored in the memory cell according to the array and reference voltages when the circuit is in a determining state, and means for increasing a first value of an array current supplied to the memory cell when the circuit is in an equalizing state relative to a second value of the array current supplied to the memory cell when the circuit is in the determining state;

wherein a ratio of the first value of the array current to a first value of a reference current supplied to the reference cell when the circuit is in the equalizing state is greater than a ratio of the second value of the array current to a second value of the reference current supplied to the reference cell when the circuit is in the determining state.

30. The circuit of claim 12, wherein the first current source and the second current source are formed by load transistors configured as a current mirror.

* * * * *